(12) United States Patent
Lin et al.

(10) Patent No.: US 6,455,355 B1
(45) Date of Patent: Sep. 24, 2002

(54) METHOD OF MOUNTING AN EXPOSED-PAD TYPE OF SEMICONDUCTOR DEVICE OVER A PRINTED CIRCUIT BOARD

(75) Inventors: Chieh-Yuan Lin, Chiayi; Jui-Yi Chuang; Chi-Chuan Wu, both of Taichung, all of (TW)

(73) Assignee: Siliconware Precision Industries, Co., Ltd. (TW)

( * ) Notice: Subject to any disclaimer, the term of this patent is extended or adjusted under 35 U.S.C. 154(b) by 0 days.

(21) Appl. No.: 09/832,398

(22) Filed: Apr. 10, 2001

(51) Int. Cl.$^7$ ............................................... H01L 21/44
(52) U.S. Cl. .................. 438/119; 438/118; 438/460; 438/464; 257/700; 257/780
(58) Field of Search ................... 438/119, 118, 438/464, 460; 257/700, 780

(56) References Cited

U.S. PATENT DOCUMENTS

| | | | | |
|---|---|---|---|---|
| 5,557,844 A | * | 9/1996 | Bhatt et al. | 29/852 |
| 5,663,529 A | * | 9/1997 | McMillan, II et al. | 174/252 |
| 5,960,260 A | * | 9/1999 | Umehara et al. | 438/118 |
| 6,278,180 B1 | * | 8/2001 | Mizushima et al. | 257/700 |
| 2001/0010393 A1 | * | 8/2001 | Murakami | 257/684 |

FOREIGN PATENT DOCUMENTS

JP 60210858 A2 10/1985

* cited by examiner

Primary Examiner—Richard Elms
Assistant Examiner—Pho M. Luu
(74) Attorney, Agent, or Firm—Peter F. Corless; Steven M. Jensen; Edwards & Angell, LLP

(57) ABSTRACT

A modified SMT (Surface Mount Technology) process is proposed for mounting an exposed-pad type of semiconductor device over a PCB (printed circuit board), which can help prevent the problem of floated soldering of the semiconductor device over the PCB. By this modified SMT process, a plurality of via holes are formed in the pad-mounting area of the printed circuit board; and a solder material is pasted over the bottom end of each of the via holes. As the semiconductor device is mounted in position over the printed circuit board, a solder-reflow process is performed on the pasted solder material so as to cause the pasted solder material to be wetted to the entire surface of the solder-wettable layer in each of the via holes, thereby allowing the solder material to reflow to the upper end of each of the via holes where the reflowed solder is also wetted to the exposed die pad of the semiconductor device, thereby securely bonding the semiconductor device to the PCB.

5 Claims, 5 Drawing Sheets

METHOD OF MOUNTING AN EXPOSED-PAD TYPE OF SEMICONDUCTOR DEVICE OVER A PRINTED CIRCUIT BOARD

BACKGROUND OF THE INVENTION

1. Field of the Invention

This invention relates to semiconductor packaging technology, and more particularly, to a method of mounting an exposed-pad type of semiconductor device, a QFN (Quad Flat Non-leaded) package, over a PCB (printed circuit board) through a modified SMT (Surface Mount Technology) process, which can help prevent the problem of floated soldering of the semiconductor device over the PCB.

2. Description of Related Art

An exposed-pad type of semiconductor device is a type of integrated circuit package that is characterized by that the die pad, which is used to mount the packaged chip, is exposed to the bottom outside of the encapsulation body. One example of exposed-pad package is QFN (Quad Flat Non-leaded). During SMT process, the exposed-pad package is mounted onto a PCB in such a manner that the exposed surface of the die pad is directly soldered to the PCB's ground plane. This can help allow the packaged chip inside the encapsulation body to have a better grounding effect. A conventional SMT process for mounting an exposed-pad package over a PCB is illustratively depicted in the following with reference to FIGS. 1A–1E.

Referring first to FIG. 1A and FIG. 1B, this conventional SMT process is utilized for mounting an exposed-pad package 10, such as a QFN package, over a PCB 20.

The exposed-pad package 10 includes: (i) a leadframe 11 having a die pad 12 and a plurality of electrically-conductive leads 13; (ii) a semiconductor chip 14 mounted over the front surface 12a of the exposed die pad 12 and electrically coupled to the electrically-conductive leads 13 by means of a plurality of bonding wires 15, and (iii) an encapsulation body 16 for encapsulating the semiconductor chip 14 and the leadframe 11 while exposing the back surface 12b of the die pad 12 and the bottom surface 13b of the electrically-conductive leads 13 to the bottom outside thereof. The exposed-pad package 10 is so named due to the fact that its electrically-conductive leads 13 are confined within the encapsulation body 16, rather than extending sidewards beyond the encapsulation body 16, which can help reduce its layout area on the PCB 20.

The PCB 20 includes a substrate 21, a passivation layer 22, a ground plane 23, and a plurality of electrically-conductive fingers 24 on both sides of the ground plane 23. The ground plane 23 is used as a mounting area for the exposed die pad 12 of the exposed-pad package 10, and which is dimensioned to be substantially equal to the size of the exposed die pad 12 and therefore is significantly greater in area than each one of the electrically-conductive fingers 24.

Referring further to FIG. 1C, in the next step, a solder material is pasted over the ground plane 23 and all the electrically-conductive fingers 24, whereby a wide-area solder lump 31 is formed over the ground plane 23, while a plurality of small-area solder lumps 32 are formed respectively over the electrically-conductive fingers 24. At this stage, the wide-area solder lump 31 pasted over the ground plane 23 is substantially leveled in its topmost surface to the small-area solder lumps 32 pasted over the electrically-conductive fingers 24.

Referring further to FIG. 1D, in the next step, the exposed-pad package 10 is mounted onto the PCB 20, with the exposed die pad 12 being aligned to ground plane 23 and the outer leads 13 being aligned respectively to the electrically-conductive fingers 24 (i.e., the exposed surface of the die pad 12 is attached to the wide-area solder lump 31, while the outer leads 13 of the exposed-pad package 10 are attached respectively to the small-area solder lumps 32).

Next, a solder-reflow process is performed to reflow the wide-area solder lump 31 and all the small-area solder lumps 32 to thereby bond the exposed die pad 12 to the ground plane 23 and meanwhile bond the outer leads 13 respectively to the electrically-conductive fingers 24. This completes the mounting of the exposed-pad package 10 over the PCB 20.

Fundamentally, however, solder lumps would become centrally concentrated when melted during the solder-reflow process, resulting in expansion of the thickness thereof and thereby making the solder lumps bulged out. This reflow-incurred bulging height would increase with the area of the pasted solder lump.

Therefore, as illustrated in FIG. 1E, the wide-area solder lump 31 pasted over the ground plane 23 would become more expanded in thickness than the small-area solder lumps 32 pasted over the electrically-conductive fingers 24, thus undesirably bulging out the exposed-pad package 10 to an elevated position. This problem is referred to as floated soldering.

As a consequence of the floated soldering of the exposed-pad package 10 over the ground plane 23 of the PCB 20, the outer leads 13 of the exposed-pad package 10 would be lifted to an elevated position, thus being forced to break apart from the electrically-conductive fingers 24 (the broken part of the bonding is indicated by the reference numerals 40 in FIG. 1E), undesirably resulting in failed or unreliable bonding between the outer leads 13 and the electrically-conductive fingers 24. The finished circuit module constructed of the exposed-pad package 10 over the PCB 20 would be thus degraded in quality and reliability.

Related patents include, for example, the Japan Patent JP60210858A2 entitled "FLAT PACKAGE LSI". This patent teaches the use of positional pins beneath the package body to help prevent positional shift of the mounted semiconductor device over the PCB. One drawback to this patent, however, is that the provision of the pins beneath the package body would make the fabrication of the semiconductor package more difficult to implement.

SUMMARY OF THE INVENTION

It is therefore an objective of this invention to provide a new method for mounting exposed-pad package over PCB, which can help prevent the problem of floated soldering of the exposed-pad package over the PCB.

It is another objective of this invention to provide a new method for mounting exposed-pad package over PCB, which can help securely bond the exposed-pad package in position over the PCB without having to use positional pins.

It is still another objective of this invention to provide a new method for mounting exposed-pad package over PCB, which can help assure the exposed-pad package to be more reliably bonded to the PCB.

In accordance with the foregoing and other objectives, the invention proposes a new method for mounting exposed-pad package over PCB.

By the method of the invention, a plurality of via holes are formed in the pad mounting area of the printed circuit board; and a solder material is pasted over the bottom end of each of the via holes. As the semiconductor device is mounted in position over the printed circuit board, a solder-reflow process is performed on the pasted solder material so as to cause the pasted solder material to be wetted to the entire surface of the solder-wettable layer in each of the via holes, thereby allowing the solder material to reflow to the upper end of each of the via holes where the reflowed solder is also wetted to the exposed die pad of the semiconductor device, thereby securely bonding the semiconductor device to the PCB.

Compared to the prior art, since the solder material used to bond the semiconductor device to the PCB is reflowed upwards from the bottom surface of the PCB through the via holes to the upper surface of the PCB, it allows the semiconductor device to be securely bonded in position over the PCB. The invention can therefore resolve the problem of floated soldering of exposed-pad package over PCB.

BRIEF DESCRIPTION OF DRAWINGS

The invention be more fully understood by reading the following detailed description of the preferred embodiments, with reference made to the accompanying drawings, wherein.

DETAILED DESCRIPTION OF PREFERRED EMBODIMENTS

A preferred embodiment of the method according to the invention for mounting exposed-pad package over PCB is disclosed in full details in the following with reference to FIGS. 2A–2E.

Figure 1A:
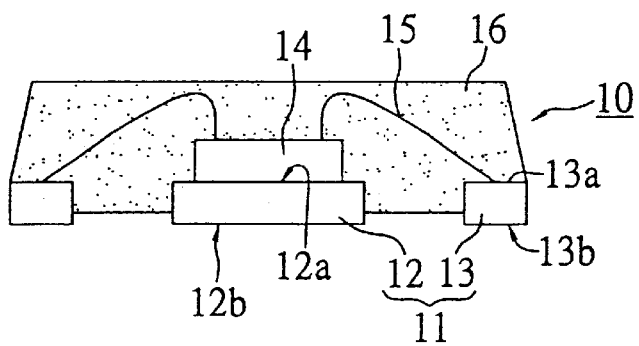
FIGS. 1A–1E (PRIOR ART) are schematic sectional diagrams used to depict a conventional method for mounting an exposed-pad package over a PCB.
Figure 1A:
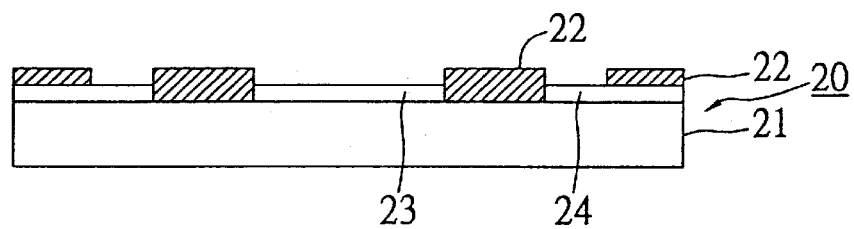
Figure 1B:
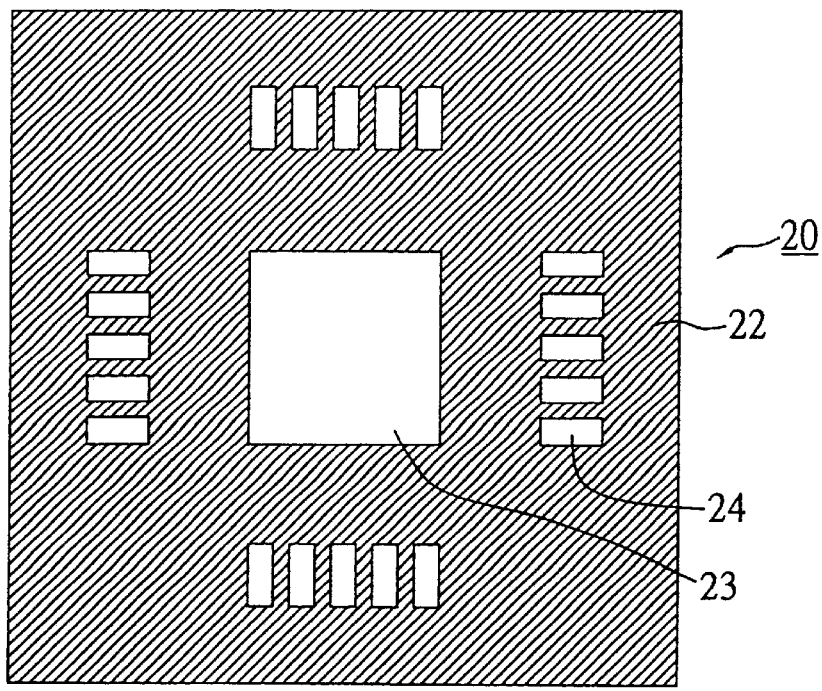
Figure 1C:
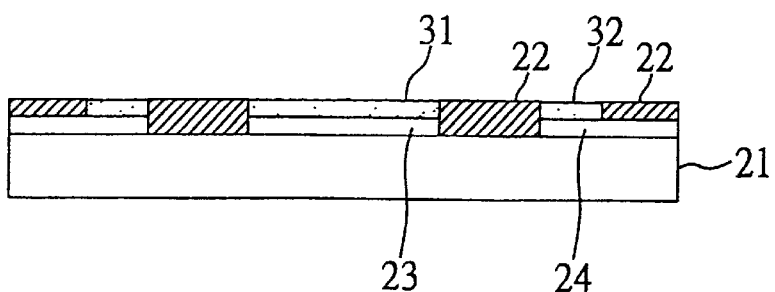
Figure 1D:
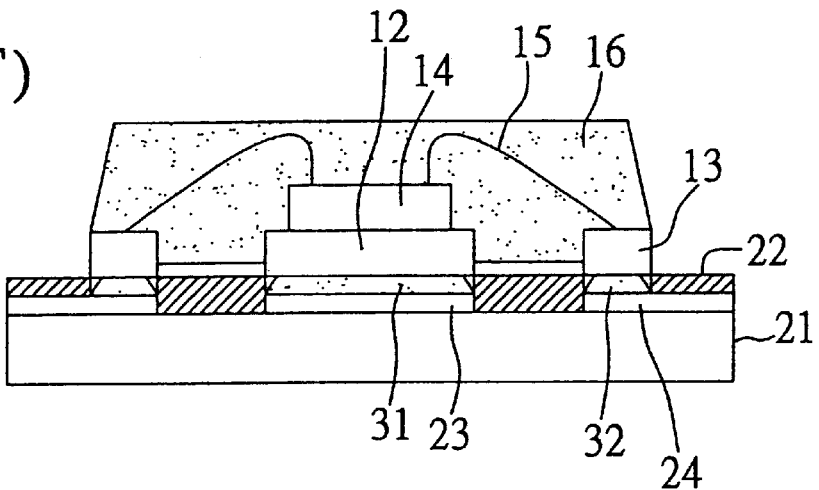
Figure 1E:
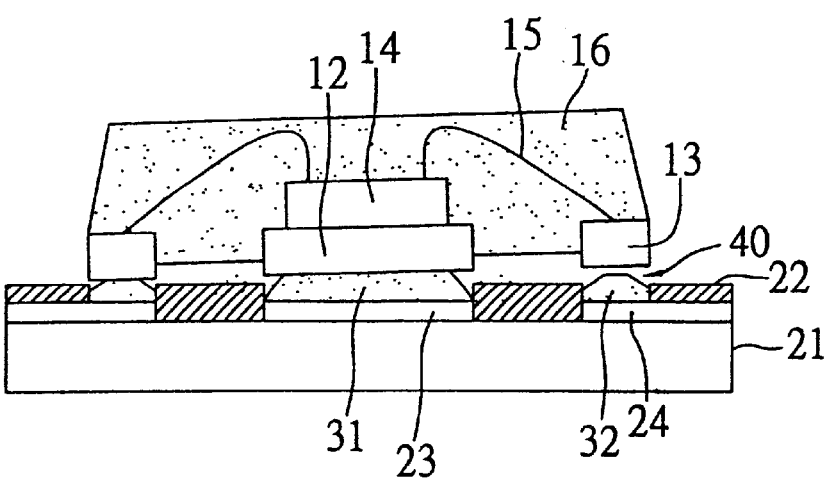
Figure 2A:
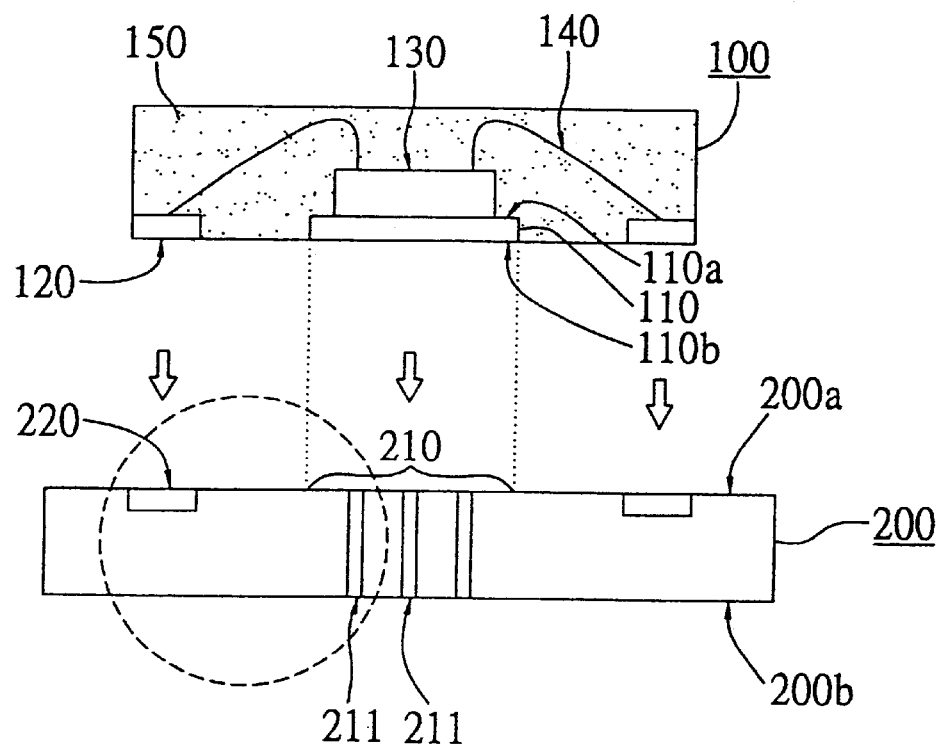
FIGS. 2A–2E are schematic sectional diagrams used to depict the method according to the invention for mounting an exposed-pad package over a PCB.

Referring first to FIG. 2A, the method of the invention is here utilized to mount an exposed-pad type of semiconductor device 100, such as a QFN package, over a printed circuit board (PCB) 200.

The semiconductor device 100 includes: (i) a die pad 110 having a front surface 1110a and a back surface 111b; (ii) a plurality of leads 120; (iii) a semiconductor chip 130 mounted on the front surface 111a of the die pad 110; (iv) a plurality of bonding wires 140 for electrically coupling the semiconductor chip 130 to the leads 120, and (v) an encapsulation body 150 for encapsulating the semiconductor chip 130 while exposing the back surface 111b of the die pad 110 and part of the leads 120 to the outside.

The PCB 200 has an upper surface 200a and a bottom surface 200b, and is predefined with a pad-mounting area 210 and a plurality of I/O contact pads 220 on the upper surface 200a; wherein the pad-mounting area 210 is used to mount the exposed die pad 110 of the semiconductor device 100 while the I/O contact pads 220 are used to mount the leads 120. By the invention, the pad-mounting area 210 of the PCB 200 is formed with a plurality of via holes 211.

Figure 2B:
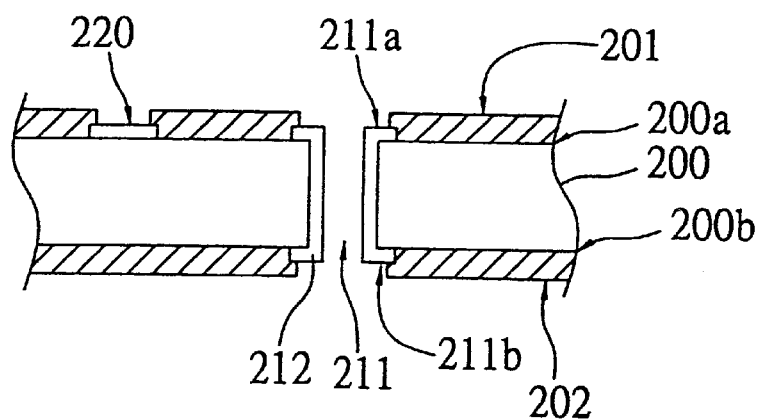

FIG. 2B shows an enlarged view of the part indicated by the dotted circle in FIG. 2A. As shown, the PCB 200 includes an upper solder mask 201 over the upper surface 200a thereof and a bottom solder mask 202 over the bottom surface 200b thereof. Further, a solder-wettable layer 212, such as a layer of plated copper (Cu), is formed over the inner wall of each via hole 211.

Figure 2C:
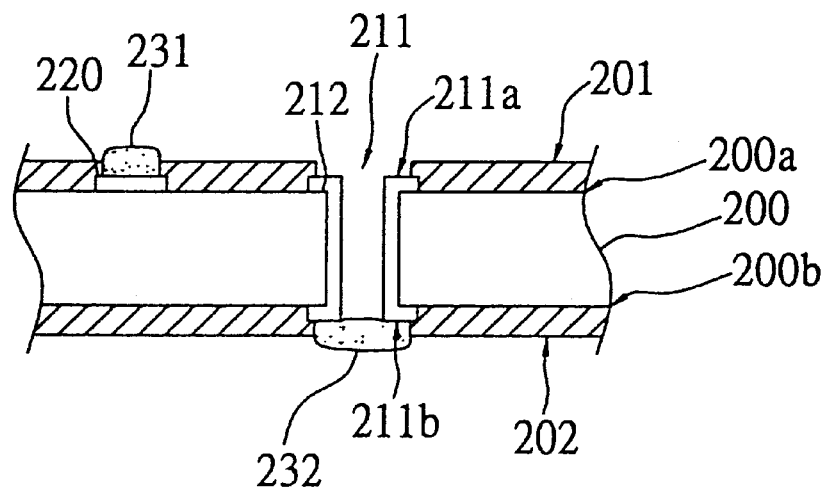

Referring further to FIG. 2C, in the next step, a solder-pasting process is performed to paste a solder material over each I/O contact pad 220 and also over the bottom end 211b of each via hole 211, thereby providing a first solder lump 231 over each I/O contact pad 220 and a second solder lump 232 over the bottom end 211b of each via hole 211. Since the solder-pasting process is a conventional technique, detailed steps thereof will not be further described.

Figure 2D:
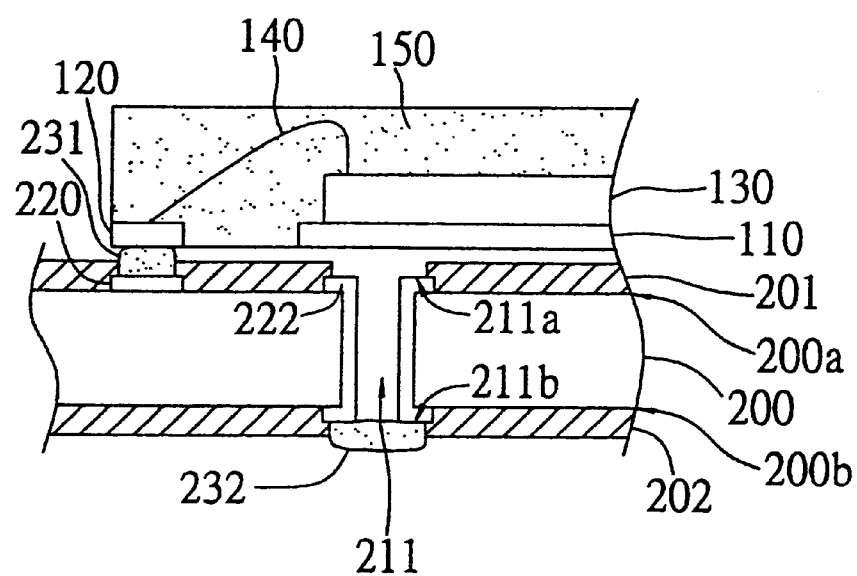

Referring further to FIG. 2D, in the next step, the semiconductor device 100 is mounted over the PCB 200 in such a manner that its exposed die pad 110 is abutted on the pad-mounting area 210 of the PCB 200, while its exposed lead 120 is aligned to the I/O contact pad 220 and abutted on the first solder lump 231.

Figure 2E:
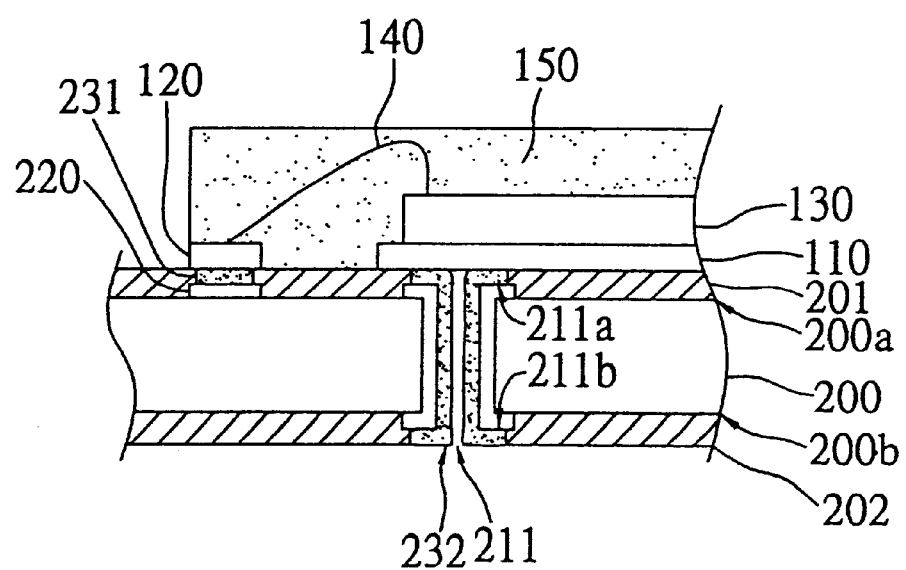

Referring further to FIG. 2E, in the next step, a solder-reflow process is performed to reflow both the first solder lump 231 and the second solder lump 232. During this solder-reflow process, the first solder lump 231 is melted and wetted both to the entire I/O contact pad 220 and the entire lead 120, thereby bonding the I/O contact pad 220 with the lead 120; and meanwhile, the second solder lump 232 is melted and wetted to the entire solder-wettable layer 212, thereby reflowing vertically upwards through the via hole 211 to reach the upper end 211a of the via hole 211 where the reflowed second solder lump 232 is further wetted to the exposed back surface 111b of die pad 110 of the semiconductor device 100, thereby bonding the semiconductor device 100 to the PCB 200. This completes the SMT process for mounting the semiconductor device 100 over the PCB 200 by the method of the invention.

Compared to the prior art, since the solder material used to bond the semiconductor device 100 to the PCB 200 is reflowed upwards from the bottom surface 200b of the PCB 200 through the via holes 211 to the upper surface 200a of the PCB 200, it allows the exposed die pad 110 of the semiconductor device 100 to be securely bonded to the PCB 200. The invention can therefore resolve the problem of floated soldering of exposed-pad package over PCB that would otherwise cause undesired positional shift to the mounted device. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for mounting an exposed-pad type of semiconductor device having an exposed die pad over a printed circuit board; the printed circuit board having an upper side and a bottom side;

the method comprising the steps of:

(1) defining a pad-mounting area on the upper side of the printed circuit board;

(2) forming a plurality of via holes in the pad-mounting area of the printed circuit board; each via hole having an upper end on the upper side of the printed circuit board and a bottom end on the bottom side of the same, and each via hole including a solder-wettable layer over the inner wall thereof;

(3) pasting a solder material over the bottom end of each of the via holes;

(4) mounting the semiconductor device over the upper side of the printed circuit board, with the exposed die pad thereof being abutted on the pad-mounting area of the printed circuit board; and (5) performing a solder-reflow process on the pasted solder material over the bottom end of each of the via holes so as to allow the pasted solder material to be wetted over the entire surface of each solder-wettable layer, thereby allowing the reflowed solder material to reach the upper end of each of the via holes where the reflowed solder material is further wetted to the exposed die pad of the semiconductor device, thereby bonding the semiconductor device to the printed circuit board.

2. The method of claim 1, wherein the exposed-pad type of semiconductor device is a QFN package.

3. The method of claim 1, wherein in said step (2), the solder-wettable layer is a plated copper layer.

4. A method for mounting an exposed-pad type of semiconductor device having an posed die pad over a printed circuit board; the printed circuit board having an upper surface and a bottom surface;

the method comprising the steps of:
(1) defining a pad-mounting area on the upper side of the printed circuit board;
(2) forming a plurality of via holes in the pad-mounting area of the printed circuit board; each via hole having an upper end on the upper side of the printed circuit board and a bottom end on the bottom side of the same, and each via hole including a plated copper layer over the inner wall thereof;
(3) pasting a solder material over the bottom end of each of the via holes;
(4) mounting the semiconductor device over the upper side of the printed circuit board, with the exposed die pad thereof being abutted on the pad-mounting area of the printed circuit board; and
(5) performing a solder-reflow process on the pasted solder material over the bottom end of each of the via holes so as to allow the pasted solder material to be wetted over the entire surface of each plated copper layer, thereby allowing the reflowed solder material to reach the upper end of each of the via holes where the reflowed solder material is further wetted to the exposed die pad of the semiconductor device, thereby bonding the semiconductor device to the printed circuit board.

5. The method of claim 4, wherein the exposed-pad type of semiconductor device is a QFN package.

* * * * *